United States Patent
Selander et al.

(10) Patent No.: US 9,933,481 B2
(45) Date of Patent: Apr. 3, 2018

(54) TESTING A FEEDBACK SHIFT-REGISTER

(71) Applicant: Telefonaktiebolaget LM Ericsson (publ), Stockholm (SE)

(72) Inventors: Göran Selander, Bromma (SE); Mats Näslund, Bromma (SE); Elena Dubrova, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 17 days.

(21) Appl. No.: 15/038,617

(22) PCT Filed: Nov. 28, 2013

(86) PCT No.: PCT/SE2013/051407
§ 371 (c)(1),
(2) Date: May 23, 2016

(87) PCT Pub. No.: WO2015/080637
PCT Pub. Date: Jun. 4, 2015

(65) Prior Publication Data
US 2016/0299189 A1 Oct. 13, 2016

(51) Int. Cl.
*G01R 11/00* (2006.01)
*G01R 31/317* (2006.01)
(Continued)

(52) U.S. Cl.
CPC ... *G01R 31/31703* (2013.01); *G01R 31/3177* (2013.01); *G01R 31/31723* (2013.01);
(Continued)

(58) Field of Classification Search
None
See application file for complete search history.

(56) References Cited

U.S. PATENT DOCUMENTS 4,975,640 A   12/1990   Lipp
5,090,035 A    2/1992   Murase
(Continued)

OTHER PUBLICATIONS

International Search Report and Written Opinion of the International Searching Authority, Application No. PCT/SE2013/051407, dated Sep. 10, 2014.
(Continued)

*Primary Examiner* — Daniel McMahon
(74) *Attorney, Agent, or Firm* — Sage Patent Group

(57) ABSTRACT

A Feedback Shift-Register (FSR) enabling improved testing, e.g., Built-In Self-Tests (BIST), is provided. Each cell of the FSR may either be an observable cell, associated with a non-trivial feedback function implemented by a combinational logic circuit, or a controllable cell, having an associated state variable which belongs to the dependence set of exactly one of the non-trivial feedback functions. Each controllable cell is provided with a multiplexer for selecting either a predecessor cell of the controllable cell or a test value as input. Thus, the sequential circuit of the FSR in an embodiment is tested using tests for combinational logic. The disclosed test procedures utilize a minimal set of test vectors and allow detection of all single stuck-at faults in the FSR. The resulting dynamic power dissipation during test can be considerably less than known BIST designs.

17 Claims, 6 Drawing Sheets

(51) Int. Cl.
    *G01R 31/3181*    (2006.01)
    *G11C 19/28*     (2006.01)
    *G01R 31/3185*    (2006.01)
    *G11C 29/02*     (2006.01)
    *G01R 31/3177*    (2006.01)

(52) U.S. Cl.
    CPC ............... *G01R 31/31813* (2013.01); *G01R 31/318547* (2013.01); *G11C 19/28* (2013.01); *G11C 29/02* (2013.01); *G11C 29/021* (2013.01)

(56) References Cited

U.S. PATENT DOCUMENTS

| | | | |
|---|---|---|---|
| 5,450,414 A | 9/1995 | Lin | |
| 7,346,823 B1 * | 3/2008 | Maheshwari | G01R 31/318547 714/733 |
| 7,428,681 B2 * | 9/2008 | Kang | G01R 31/318536 714/738 |
| 2004/0030976 A1 * | 2/2004 | Ghameshlu | G01R 31/318547 714/732 |

OTHER PUBLICATIONS

Hell et al. "The Grain Family of Stream Ciphers," in *New Stream Cipher Designs, LNCS 4986*, ed. Matthew Robshaw et al. (Berlin: Springer-Verlag, 2008), 179-190.

De Cannière et al. "Trivium," in *New Stream Cipher Designs, LNCS 4986*, ed. Matthew Robshaw et al. (Berlin: Springer-Verlag, 2008), 244-266.

Reddy, "Easily Testable Realizations for Logic Functions," in IEEE Transactions on Computers, vol. c-21, No. 11, pp. 1183-1188 (Nov. 1972).

\* cited by examiner

TESTING A FEEDBACK SHIFT-REGISTER

CROSS REFERENCE TO RELATED APPLICATION

This application is a 35 U.S.C. § 371 national stage application of PCT International Application No. PCT/SE2013/051407, filed on Nov. 28, 2013, the disclosure and content of which is incorporated by reference herein in its entirety. The above-referenced PCT International Application was published in the English language as International Publication No. WO 2015/080637 A1 on Jun. 4, 2015.

TECHNICAL FIELD

The invention relates to a Feedback Shift-Register (FSR), a method of testing an FSR, a corresponding computer program, and a corresponding computer program product.

BACKGROUND

The solutions described herein relate to hardware implementations of cryptographic systems based on FSRs, which are envisioned to be used as pseudo-random number generators in next generation stream ciphers such as Grain (see, e.g., M. Hell, T. Johansson, A. Maximov, and W. Meier, The Grain Family of Stream Ciphers", in New Stream Cipher Designs: The eSTREAM Finalists", Lecture Notes in Computer Science, Vol. 4986, Springer 2008) and Trivium (see, e.g., C. De Cannière and B. Preneel, "Trivium", Ibid.). A stream cipher is a symmetric key cipher which logically combines plaintext digits, typically bits, with a pseudo-random digit stream, the keystream, to give the ciphertext stream. Speed and power are two crucial factors for future cryptographic systems, since they are expected to support very high data rates in 5G ultra-low power products and applications.

A hardware fault in a cryptographic system may negatively affect its security. Therefore, it is desirable that cryptographic systems perform Built-In Self-Tests (BIST) during their life-time. Integrated circuits (IC) with BIST functionality typically incorporate on-chip logic for test generation and test response analysis. Logic BIST (LBIST), which is used for testing random digital logic, typically employs a Linear FSR (LFSR) for generating pseudo-random test patterns which are applied to the circuit under test, and a Multiple Input Signature Register (MISR) for obtaining the compacted response of the circuit to these test patterns. An incorrect MISR output indicates a fault in the circuit under test.

LBIST is typically used in a combination with scan design, which is a design-for-test technique providing a simple way of setting and observing each cell, or storage element, in the sequential circuit of an FSR. In scan design, all storage elements of the FSR are connected into one or more shift registers, called scan chains, by multiplexing their respective inputs to support a scan mode which allows serial loading and unloading of the scan chain's contents. For each scan chain, an arbitrary test pattern is loaded into the chain of storage elements, and the state of every storage element is read out. In normal operational mode, the scan chains do not affect operation of the circuit.

Traditional LBIST designs suffer from a number of drawbacks. Firstly, the propagation delay in scan design is increased by the delay of the additional multiplexers (MUXs). This may cause a substantial increase of the overall delay for cryptographic systems. For the Trivium stream cipher, e.g., the additional multiplexers cause the propagation delay of the circuit to increase by 30%, thereby decreasing the maximum supported data rate by a corresponding amount.

Secondly, traditional LBIST designs utilize pseudo-random sequences as test patterns. Therefore, many sequences have to be applied to reach satisfactory fault coverage, resulting in long testing times. In applications which use LBIST for in-field testing, e.g., Radio Base Stations (RBS), the available time for testing is limited since it is desirable to bring an RBS back to normal operation as quickly as possible. In addition, when pseudo-random sequences are use as test patterns, the switching activity in the circuit under test, i.e., the number of storage elements which change their state, is typically very high. High switching activity results in excess dynamic power dissipation, which may lead to overheated circuits, thereby decreasing reliability. High switching activity may also cause a voltage drop across the circuit, commonly referred to as IR drop. As a result, a fault-free circuit may be reported as faulty.

SUMMARY

It is an object of the invention to provide an improved alternative to the above techniques and prior art.

More specifically, it is an object of the invention to provide an improved testing of FSRs. In particular, it is an object of the invention to provide an improved testing of FSRs for cryptographic applications.

These and other objects of the invention are achieved by means of different aspects of the invention, as defined by the independent claims. Embodiments of the invention are characterized by the dependent claims.

According to a first aspect of the invention, an FSR is provided. The FSR comprises a plurality of cells, each cell having an associated binary state variable which represents a current value of the cell and an associated Boolean feedback function which determines how the state variable is updated. The feedback function is of type $$f_i(x_0, x_1, \ldots, x_{N-1}) = x_{i+1} \oplus g_i(x_0, x_1, \ldots, x_{N-1}).$$

The plurality of cells comprises one or more observable cells and one or more controllable cells. Each observable cell is associated with a non-trivial feedback function implemented by a combinational logic circuit. The associated state variable of each controllable cell belongs to a dependence set of exactly one of the non-trivial feedback functions. Each cell may be a controllable cell or an observable cell, but not both. Further, each controllable cell is provided with a multiplexer being arranged for selecting either a predecessor cell of the controllable cell or a test value as input. In addition, each observable cell is arranged for making available its current value as test response. The FSR is adapted to acquire at least one test vector, and for each test vector, load the test vector into the controllable cells and evaluate, for each observable cell, the test response of the associated combinational logic circuit for the loaded test values. Each test vector comprises test values $t_n$, $n \in \{0, 1, \ldots, K\}$, wherein K+1 is a size of the largest dependence set of all non-trivial feedback functions. For each non-trivial feedback function $f_i$, the value of $t_0$ is loaded into the cell i+1, and, for all $n \in \{1, \ldots, K\}$, the value of $t_n$ is loaded into the controllable cell corresponding to the n-th variable in the dependence set of $g_i$. The test responses are indicative of a fault in the FSR.

According to a second aspect of the invention, a method of testing an FSR is provided. The FSR comprises a plurality of cells, each cell having an associated binary state variable which represents a current value of the cell and an associated Boolean feedback function which determines how the state variable is updated. The feedback function is of type $$f_i(x_0, x_1, \ldots, x_{N-1}) = x_{i+1} \oplus g_i(x_0, x_1, \ldots, x_{N-1}).$$

The plurality of cells comprises one or more observable cells and one or more controllable cells. Each observable cell is associated with a non-trivial feedback function implemented by a combinational logic circuit. The associated state variable of each controllable cell belongs to a dependence set of exactly one of the non-trivial feedback functions. Each cell may be a controllable cell or an observable cell, but not both. Further, each controllable cell is provided with a multiplexer being arranged for selecting either a predecessor cell of the controllable cell or a test value as input. In addition, each observable cell is arranged for making available its current value as test response. The method comprises providing at least one test vector, and for each test vector, loading the test vector into the controllable cells and evaluating, for each observable cell, the test response of the associated combinational logic circuit for the loaded test values. Each test vector comprises test values $t_n$, $n \in \{0, 1, \ldots, K\}$, wherein K+1 is a size of the largest dependence set of all non-trivial feedback functions. For each non-trivial feedback function $f_i$, the value of $t_0$ is loaded into the cell i+1, and, for all $n \in \{1, \ldots, K\}$, the value of $t_0$ is loaded into the controllable cell corresponding to the n-th variable in the dependence set of $g_i$. The test responses are indicative of a fault in the FSR.

According to a third aspect of the invention, a computer program is provided. The computer program comprises instructions. The instructions are adapted, if executed on at least one processor, to implement the method according to an embodiment of the second aspect of the invention.

According to a fourth aspect of the invention, a computer program product is provided. The computer program product comprises a computer readable storage medium. The computer readable storage medium has the computer program according to the third aspect of the invention embodied therein.

The invention makes use of an understanding that an improved testing of FSRs may be achieved by providing the controllable cells of the FSR with MUXs for selecting either a predecessor cell of the controllable cell or a test value as input. Thereby, the controllable cells become inputs of a combinational logic which the FSR provides. As a result, the sequential circuit of the FSR may be tested using tests for combinational logic. This is advantageous in comparison to the prior art in that the propagation delay of the original design does not increase, as is the case for FSRs with BIST functionality based on scan design. Thus, an FSR with BIST functionality in accordance with an embodiment of the invention can support the same data rate as the original design. Additionally, by providing a minimal test set and test procedures adapted to take advantage of an FSR in accordance with an embodiment of the invention, dynamic power dissipation during test is considerably reduced in comparison to implementations based on scan design. Further, utilizing the minimal test set in accordance with an embodiment of the invention results in much short testing times.

The techniques defined by the independent claims correspond to the first test procedure elaborated further below. To this end, by utilizing the test set in accordance with an embodiment of the invention, the first test procedure is capable of detecting all single stuck-at faults, i.e., stuck-at-zero and stuck-at-one faults, at the inputs and outputs of all XOR gates in the FSR as well as all stuck-at zero faults at the inputs of all AND gates in the FSR. The first test procedure completes the application all test vectors in the test set and evaluation of all output responses in K+5 clock cycles.

According to an embodiment of the invention, the FSR is further adapted to perform a second test procedure which is capable of detecting all stuck-at faults at internal cells, i.e., cells which are neither controllable nor observable cells. The second test procedure completes the application of all test vectors in the test set and evaluation of all output responses in 2d+6 clock cycles, where d is the maximum distance between two controllable cells of the FSR.

According to an embodiment of the invention, the FSR further comprises means adapted to provide the at least one test vector. Preferably, the means is adapted to provide a complete minimal test set in accordance with an embodiment of the invention.

According to an embodiment of the invention, the FSR further comprises means adapted to, for each test vector and for each observable cell, verify if the test response equals the corresponding expected value and indicate a fault if the test response does not equal the corresponding expected value.

According to an embodiment of the invention, the FSR further comprises means adapted to perform a self-test of the FSR.

Embodiments of the invention comprising means adapted to provide test vectors, means to adapted to verify test responses and indicate faults, and means adapted to perform a self-test in accordance with the procedures disclosed herein, are advantageous in that FSR designs with BIST functionality can be provided.

According to an embodiment of the invention, the FSR further comprises means for selectively making available the current value of each observable cell as test response only when a test response is expected. This is advantageous in that operation of the means adapted for analyzing the test responses is limited to clock cycles for which a valid test response is expected. Thereby, power dissipation during test is reduced.

Even though advantages of the invention have in some cases been described with reference to embodiments of the first or the second aspect of the invention, corresponding reasoning applies to embodiments of other aspects of the invention.

Further objectives of, features of, and advantages with, the invention will become apparent when studying the following detailed disclosure, the drawings and the appended claims. Those skilled in the art realize that different features of the invention can be combined to create embodiments other than those described in the following.

BRIEF DESCRIPTION OF THE DRAWINGS

The above, as well as additional objects, features and advantages of the invention, will be better understood through the following illustrative and non-limiting detailed description of embodiments of the invention, with reference to the appended drawings, in which.

All the figures are schematic, not necessarily to scale, and generally only show parts which are necessary in order to elucidate the invention, wherein other parts may be omitted or merely suggested.

DETAILED DESCRIPTION

The invention will now be described more fully herein after with reference to the accompanying drawings, in which certain embodiments of the invention are shown. This invention may, however, be embodied in many different forms and should not be construed as limited to the embodiments set forth herein. Rather, these embodiments are provided by way of example so that this disclosure will be thorough and complete, and will fully convey the scope of the invention to those skilled in the art.

Figure 1:
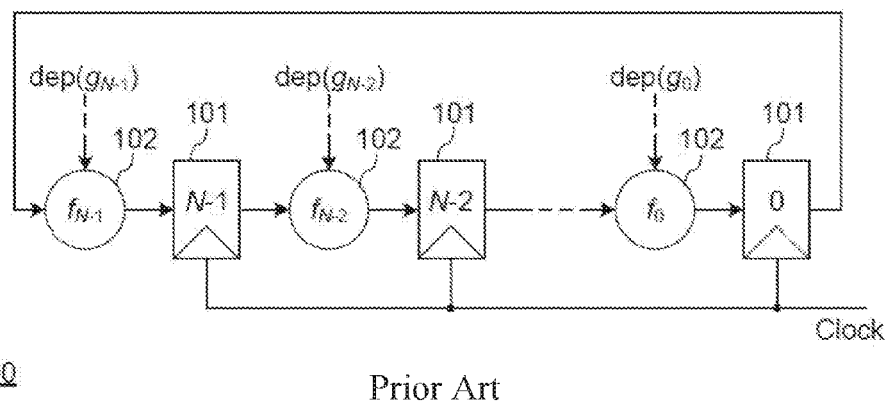
FIG. 1 illustrates the general structure of an FSR.

In FIG. 1, an N-bit FSR 100 with N binary cells 101, i.e., storage elements, also referred to as taps or stages, is illustrated. Each cell i, $i \in \{0, 1, \ldots, N-1\}$, has an associated state variable $x_i \in \{0,1\}$, which represents the current value of the cell i, and a Boolean feedback function 102 $f_i$: $\{0,1\}^N \to \{0,1\}$ of type $$f_i(x_0, x_1, \ldots, x_{N-1}) = x_{i+1} \oplus g_i(x_0, x_1, \ldots, x_{N-1}), \quad (1)$$

which determines how the value of $x_i$ is updated at each clock cycle, where "$\oplus$" is Boolean XOR and "+" is addition modulo N. If $g_i = 0$, $f_i$ is called trivial, otherwise $f_i$ is non-trivial. The variable $x_{i+1}$ of $f_i$ is called the free variable.

A cell i having a state variable $x_i$ which belongs to the dependence set of a non-trivial feedback function $f_j$, i.e., $x_i \in \text{dep}(f_j)$, is referred to as controllable cell. The dependence set of a Boolean function $f$ is defined by $\text{dep}(f) = \{i, f|_{x_i=0} \neq f|_{x_i=1}\}$, where $f|_{x_i=j} = f(x_0, \ldots, x_{i-1}, j, x_{i+1}, \ldots, x_{n-1})$ for $j \in \{0,1\}$. In other words, the state variable $x_i$ serves as input to the non-trivial feedback function $f$. Further, a cell j which has a non-trivial feedback function $f_j$ associated with it, i.e., $g_j \neq 0$ according to Eq. (1), is referred to as observable cell. Here it is assumed that each cell may be a controllable cell or an observable cell, but not both. A cell which is neither a controllable cell nor an observable cell is referred to as internal cell.

The state of an FSR is a binary vector of values of its state variables, $(x_0, x_1, \ldots, x_{N-1})$. At every clock cycle (cf. the "Clock" signal in FIG. 1), the next state is determined from the current state by updating the values of all cells simultaneously in accordance with the values of the corresponding feedback functions. Thus, FSR 100 is a clocked FSR.

Any Boolean function, such as the non-trivial feedback functions 102, can be represented in Algebraic Normal Form (ANF), which is a representation of type $$f(x_1, \ldots, x_n) = \sum_{i=0}^{2^n-1} c_i \cdot x_1^{i_1} \cdot x_2^{i_2} \cdots x_n^{i_n}, \quad (2)$$

where $c_i \in \{0,1\}$ are constants, "." is Boolean AND, and the sum is Boolean XOR. The vector $(i_1, i_2, \ldots, i_n)$ is the binary expansion of i with $i_1$ being the least significant digit. The notation "$x_j^{i_j}$" is the $i_j$-th power of the variable $x_j$, $j \in \{1, \ldots, n\}$. In particular, $x_j^0 = 1$ and $x_j^1 = x_j$. An expression consisting of one or more variables connected by AND is called product term.

An FSR 100 may be implemented by random digital logic. More specifically, each cell 101 of an FSR 100 may be implemented by a binary storage element, such as a flip-flop, e.g., a D flip-flop, and each non-trivial feedback function 102 may be implemented by a combinational logic circuit.

In particular, any Boolean function, such as the non-trivial feedback functions 102, represented in ANF can be implemented by a logic circuit comprising a linear cascade of two-input XOR gates fed by AND gates, one AND gate corresponding to each product term of the expression in Eq. (2) which has a non-zero constant $c_i$.

Figure 2:
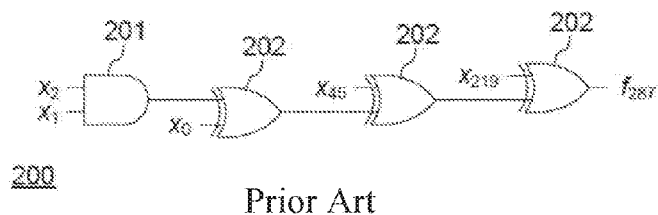
FIG. 2 exemplifies a logic circuit implementing a non-trivial feedback function.

For instance, one of the three non-trivial feedback functions of Trivium, $$f_{287} = x_0 \oplus x_1 x_2 \oplus x_{45} \oplus x_{219}, \quad (3)$$

may be implemented by a logic circuit 200 shown in FIG. 2. Logic circuit 200 comprises one AND gate 201, representing the product term $x_1 x_2$ in Eq. (3), and three XOR gates 202.

Traditional LBIST typically employs an LFSR for generating pseudo-random test patterns which are applied to the circuit under test, and an MISR for obtaining the compacted response of the circuit to these test patterns. An incorrect MISR output indicates a fault in the circuit. One problem with traditional LBIST is that many pseudo-random patterns, in the order of several thousand or more, need to be applied in order to reach satisfactory fault coverage. This implies long testing times, which hampers the application of LBIST for in-field testing, e.g., in RBSs, since it is desirable to bring an RBS back to service as quickly as possible.

Another problem which is associated with pseudo-random test patterns is a high switching activity in the circuit under test. Switching activity is related to the number of cells which change their value from 0 to 1, or vice versa. High switching activity results in excess dynamic power dissipation, which has at least two undesirable consequences. Firstly, the circuit under test may get overheated, thereby decreasing its reliability. Secondly, IR-drop may cause a correctly functioning circuit to be reported as faulty. IR-drop refers to the amount of change in power/ground rail voltage due to the resistance of devices between the rail and a cell of interest in the circuit under test.

A fault in an electronic circuit is a physical defect of one or more components which can cause the circuit to malfunction. Many physical faults in electronic circuits can be modeled by a stuck-at fault logic model. In this model, it is assumed that any physical defect (such as, e.g., a short-circuited or open diode, a broken wire, etc.) can be modeled by a number of lines in the corresponding logic circuit to be permanently fixed at the logic value 0 ("low") or 1 ("high"), respectively.

A set of test vectors is called a test set for some set of faults if observation of the corresponding test responses allows the detection of every fault in the set of faults. For instance, for an n-input combinational circuit without any redundant elements, the set of $2^n$ possible input vectors is a test set for the circuit. Obviously, an exhaustive application of all possible input vectors is not feasible for large n. One of the objectives of testing is therefore to construct minimal test sets, reducing testing time and power dissipation during test.

Scan is a design-for-test technique which provides a simple way of controlling and observing each storage element, or flip-flop, in a sequential circuit, such as an FSR. It allows testing a sequential circuit with tests for pure combinational logic, which are less complex. In a scan design, all flip-flops in a circuit are connected into one or more shift registers, called scan chains, by multiplexing their inputs to support a scan mode that allows for serial loading and unloading of each scan chain's content. This is illustrated in FIG. 3, which shows an exemplary 5-bit FSR 300 in scan design.

Figure 3:
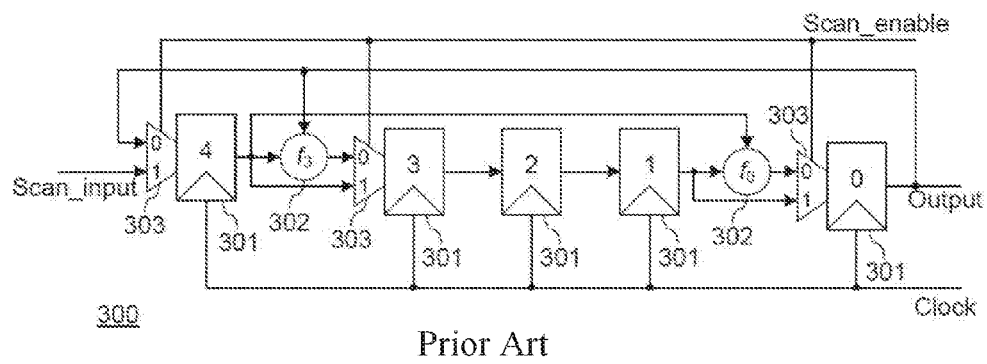
FIG. 3 illustrates an FSR with BIST based on scan design.

FSR 300 exemplified in FIG. 3 is based on five cells 301, i.e., storage elements, such as flip-flops. Cells 301 with indices 1, 2, and 4, have trivial feedback functions $f_1$, $f_2$, and $f_4$, respectively, associated with them. That is, their respective state variable is at each clock cycle updated with the value of the state variable of a predecessor cell, $f_i=x_{i+1}$, where "+" is addition modulo N. Specifically, the state variable of cell 1 is updated with the value of cell 2, the state variable of cell 2 is updated with the value of cell 3, and the state variable of cell 4 is updated with the value of cell 0. Further, cell 0 has an associated non-trivial feedback function 302 $f_0(x_1,x_4)$, and cell 3 has an associated non-trivial feedback function 302 $f_3(x_0, x_4)$.

In order to provide FSR 300 with built-in test functionality by means of scan design, each cell 301 of FSR 300 which either serves as input for scan data during test mode, such as cell 4, or has a non-trivial feedback function, such as cells 0 and 3, is provided with a MUX 303 for selecting between a normal mode of operation and a scan mode of operation. Selection is achieved by means of a signal "Scan_enable" which is used to select either one of normal mode and scan mode. More specifically, when "Scan_enable" is "high", the MUXs 303 select the inputs marked "1" as input, thereby connecting the sequence of cells 301 into a scan chain. In scan mode, an arbitrary test pattern can be loaded into the chain of cells 301 via the "Scan_input", and the state of the cells 301 can be observed via the "Output", which is also used as functional output in normal mode. In normal mode, i.e., when "Scan_enable is "low", the MUXs 303 select the inputs marked "0" as input, and the scan chain does not affect normal operation of the circuit. The "Clock" signal is used to control the cells 301 during shift operation, as is known in the art.

The testing process in scan design typically consists of the following steps. First, scan mode is selected, by setting "Scan_enable" to "high". Then, test vectors comprising binary test values are serially loaded into the scan chains via "Scan_input". When the scan chain is completely loaded, which requires one clock cycle for each flip-flop of the scan chain, normal mode is selected by setting "Scan_enable" to "low". After one subsequent clock cycle the loaded test vectors are input to the combinational logic in the design and responses may be observed at the outputs of the combinational logic. These responses are captured by the flip-flops in the scan chains. Finally, scan mode is selected again and the state of the scan chain is unloaded via the "Output". While the captured responses are shifted out of the scan chain, the system can load the next test pattern into the scan chain.

A problem associated with scan design is that the propagation delay of the original design is increased by the delay of a MUX. For a cryptographic system, this may cause a substantial increase of the overall delay.

Figure 4:
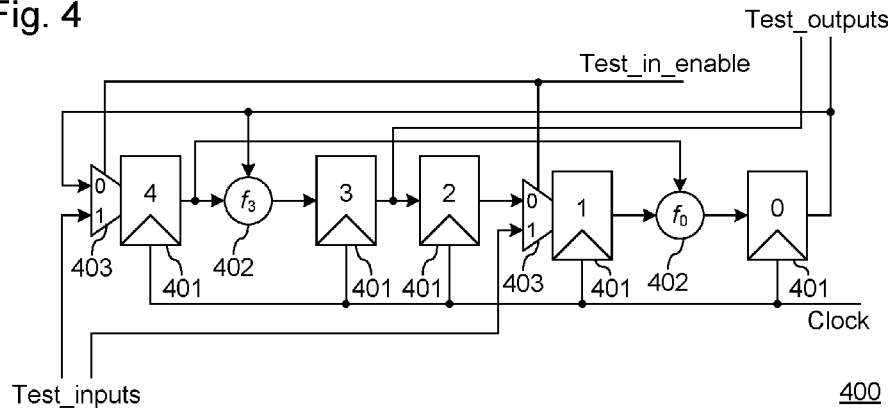
FIG. 4 illustrates an FSR, in accordance with an embodiment of the invention.
Figure 4:
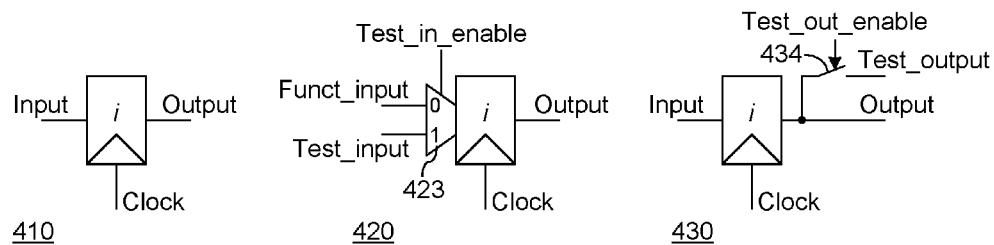

In the following, an FSR 400 with built-in test functionality, in accordance with an embodiment of the invention, is described with reference to FIG. 4. For the purpose of elucidating the invention, example FSR 400 is based on the same set of feedback functions as FSR 300 shown in FIG. 3. That is, both scan-design FSR 300 as well as FSR 400 shown in FIG. 4 are based on the same underlying FSR which consists of five cells (301 and 401, respectively), two non-trivial feedback functions $f_0$ and $f_3$ (302 and 402, respectively), and three trivial feedback functions $f_1$, $f_2$, and $f_4$ (i.e., $f_i=x_{i+1}$).

FSRs with test functionality in accordance with an embodiment of the invention are similar to scan design in that a simple way of controlling, i.e., setting and observing each cell in the sequential circuit of an FSR, is provided. However, unlike scan design, cells are not connected in scan chains. Instead, to support test functionality, the original FSR is modified by multiplexing the input of each controllable cell (cells 1 and 4 of FSR 400), as is shown in FIG. 4. This is achieved by providing the input of each controllable cell 410 of the FSR with a MUX 423. The resulting cell 420 has a functional input ("Funct_input") and a test input ("Test_input"). Which one of the two inputs is connected to the storage element, i.e., the flip-flop, is determined by the signal "Test_in_enable". For instance, as is illustrated in FIG. 4, the functional input of the cell 420 is selected if "Test_in_enable" is "low", and the test input of the cell 420 is selected if "Test_in_enable" is "high". It will be appreciated that embodiments of the invention are not limited to this particular choice.

By providing the inputs of each controllable cell 401 (cells 1 and 4) with a MUX 403, the resulting FSR 400 can be toggled between a normal mode of operation, if "Test_in_enable" is "low", in which all cells 401 are interconnected through their respective feedback functions, and a test mode of operation, if "Test_in_enable" is "high", in which the inputs of the controllable cells are made available for externally controlling the respective state of each of the controllable cells. This may be achieved by setting the value of each controllable cell using the "Test_inputs" shown in FIG. 4, one test input for each controllable cell. The test inputs may, e.g., connected to circuitry providing test signals, such as the Test Vector Generator (TVG) described further below.

To this end, when test mode is selected, the cells with multiplexed inputs, the controllable cells, become inputs to the combinational logic of the FSR. As in a scan design, this increases controllability and observability by making it possible to test the sequential circuit of the FSR with tests for combinational logic. The test results can be observed at the outputs of the observable cells, i.e., cells which have an associated non-trivial feedback function (cells 0 and 3 of FSR 400). The current values of the observable cells' state variables is made available via test outputs ("Test_outputs" in FIG. 4), one for each observable cell. The test outputs may be connected to circuitry which is adapted to analyze the test responses and output the result of a test, such as the Test Result Analyzer (TRA) described further below.

Note that the proposed technique does not affect the propagation delay of the original FSR. This is in contrast to scan design, in which the propagation delay is increased by the delay of a MUX. Thereby, cryptographic systems such as stream ciphers may support higher bit rates than with traditional scan design.

In the following, techniques are disclosed which allow detecting all single stuck-at faults in an FSR in accordance with an embodiment of the invention, using a test set of size (K+2)×(K+3) bits or less, where K+1 is the size of the largest dependence set of the set of non-trivial feedback functions $f_i$, i∈{0, 1, ..., N−1}. In the special case that all non-trivial feedback functions implemented by an FSR either have an even number of product terms in ANF or an odd number of product terms, but not both, as is the case for the Trivium stream cipher, the size of the test set is reduced to (K+1)×(K+3) bits. A test set in accordance with an embodiment of the invention constitutes a minimal test set for single stuck-at faults which is provably complete for the general case.

In the present disclosure cryptographic systems are targeted, and it is therefore assumed that the feedback functions of the underlying FSR, i.e., the FSR on which a cryptographic system is based, satisfy the following two properties (in accordance with recommended requirements for cryptographic security of Boolean functions, see, e.g., T. W. Cusick and P. Stănică, "Cryptographic Boolean Functions and Applications", Elsevier 2009):

If $x_i \in dep(g_h)$, then $x_i \notin dep(g_k)$ for any i, j, k∈{0, 1, ..., N−1}, j≠k. This means that the same variable does not occur more than once in ANFs of non-trivial functions. In other words, the associated state variable of each controllable cell belongs to a dependence set of exactly one of the non-trivial feedback functions.

If $g_i \neq 0$, then $x_i \notin dep(g_j)$ for any i, j∈{0, 1, ..., N−1}, i≠j. This means that the same cell is not used as both input and output of non-trivial feedback functions. In other words, a cell may either be a controllable cell or an observable cell, but not both.

A test set in accordance with an embodiment of the invention, for detecting all single stuck-at faults in an FSR having the properties described hereinbefore, consists of $$K+3 \quad (4)$$

test vectors $T_m$, m∈{1, 2, ..., K+3}, each test vector consisting of at most $$K+2 \quad (5)$$

binary values $t_n$, i.e., bits. Each test vector is applied to the controllable cells of the FSR, i.e., loaded into the test inputs of the controllable cells, one at a time, as is described further below. For each test vector, all values $t_n$ are loaded simultaneously, i.e., in parallel, into the test inputs of the controllable cells belonging to different non-trivial feedback functions $f_i$. More specifically, for each non-trivial feedback function $f_i$:

If the number of product terms in the ANF of $f_i$ is even, the value $t_{OE}$ is loaded into the cell with index i+1. Otherwise, i.e., if the number of product terms in the ANF of $f_i$ is odd, the value $t_{OD}$ is loaded into the cell with index i+1. Note that "+" is addition modulo N.

For all n∈{1, ..., K}, the value $t_n$ is loaded into the controllable cell which corresponds to the n-th variable in the dependence set of $g_i$ (note the relation between $f_i$ and $g_i$, Eq. (1)). That is, for non-trivial feedback functions $f_i$ having a dependence set which is smaller than the size K+1 of the largest dependence set, only the first $|dep(g_i)|$ values $t_n$, n∈{1, ..., $|dep(g_i)|$}, are used. $|dep(g_i)|$ is the size of the dependence set of $g_i$.

The test set may be considered as a union of a first test set and a second test set. The first test set, shown in Table 1 below, comprises test vectors $T_m$, m∈{1, 2, 3} and allows detection of all single stuck-at faults at the inputs and outputs of all XOR gates in the FSR. This is the case because the test vectors of the first test set apply both zeros and ones to each input and each output of every XOR gate, and the fact that a cascade of XOR gates always propagates any change to its output. Either one of $T_2$ and $T_3$ also detects all stuck-at-zero faults at the inputs of all AND gates, since it sets all inputs of all AND gates to "1". Also listed in Table 1 are corresponding expected output values $R_m$, one for each test vector. For the first test set, the same output value is expected for all observable cells.

TABLE 1

| $T_m$ | 0E | 0D | 1 | 2 | ... | K | $R_m$ |
|---|---|---|---|---|---|---|---|
| $T_1$ | 0 | 0 | 0 | 0 | ... | 0 | 0 |
| $T_2$ | 0 | 1 | 1 | 1 | ... | 1 | 1 |
| $T_3$ | 1 | 0 | 1 | 1 | ... | 1 | 0 |

The second test set, shown in Table 2 below, consists of K test vectors $T_m$, m∈{4, 5, ..., K+3}. For each test vector $T_m$, the value $t_m$ is set to "0", and all other values $t_n$, n≠m, are set to "1". The second test set detects all single stuck-at-one faults on the inputs of all AND gates. In general, the particular choice values of $t_{OE}$ and $t_{OD}$ does not matter for the detection of faults. Preferably, they are set to "0" and "1", respectively, to make the expected test responses $R_m$, listed in Table 2, the same for the cases of non-trivial feedback functions having even and odd number of product terms in ANF, respectively. Note that, for the second test set, the expected output values $R_m$ may differ for the different observable cells and depends on the size of the dependence set of the corresponding non-trivial feedback function $f_k$ associated with an observable cell.

TABLE 2

| | $t_n$ | | | | | | $R_m$ | |
|---|---|---|---|---|---|---|---|---|
| $T_m$ | 0E | 0D | 1 | 2 | ... | K | $|dep(f_k)| > m$ | $|dep(f_k)| \leq m$ |
| $T_4$ | 0 | 1 | 0 | 1 | ... | 1 | 0 | 1 |
| $T_5$ | 0 | 1 | 1 | 0 | ... | 1 | 0 | 1 |
| ... | | | | ... | | | ... | |
| $T_{K+3}$ | 0 | 1 | 1 | 1 | ... | 0 | 0 | 1 |

For arbitrary Boolean functions, it is also necessary to detect faults on the inputs of the logic circuit implementing ANF by sensitizing an odd number of paths from each input through the AND gates to the output of the circuit. Since XOR gates are modulo-2 adders, an even number of changes at the input of an XOR cascade cancels out and does not cause a change on the output. However, because of the assumption that no state variable occurs more than once in ANFs of non-trivial functions, only one path is sensitized by a change at some input. Therefore, no additional tests are required for detecting faults on inputs.

The test set consisting of the test vectors shown in Tables 1 and 2 constitutes a minimal test set and allows detection of all single stuck-at faults in the combinational logic implementing all non-trivial feedback functions of an FSR. In addition, it can also detect stuck-at faults at the test input and output of each controllable cell, and at the input and output of each observable cell. The test vectors may be loaded into the observable cells of an FSR by means of the test inputs which FSR 400 is provided with, if "Test_in_enable" is asserted.

Figure 5:
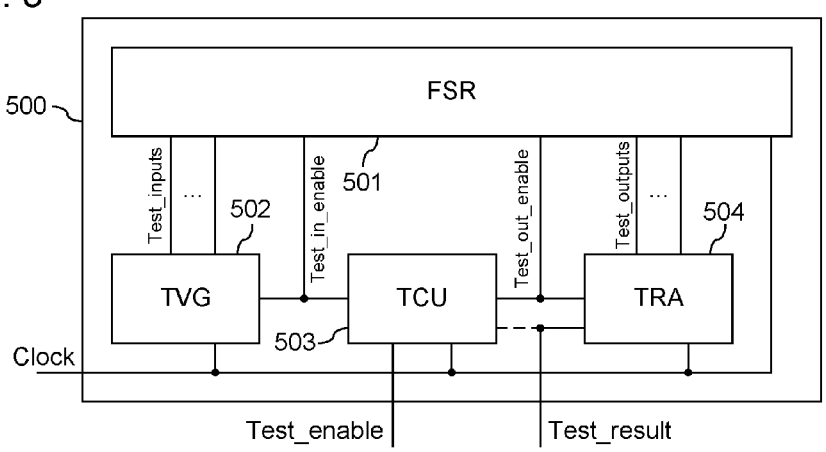
FIG. 5 shows a block diagram of an FSR design, in accordance with an embodiment of the invention.
Figure 6:
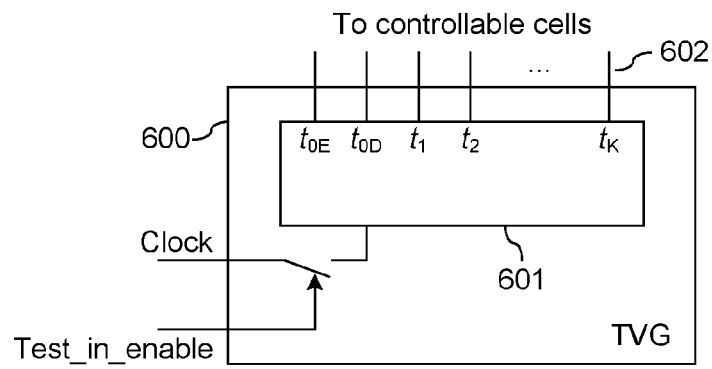
FIG. 6 illustrates a TVG, in accordance with an embodiment of the invention.

In accordance with an embodiment of the invention, the test vectors may be provided by a TVG which, preferably, is provided on-chip, i.e., together with FSR 400. This is illustrated in FIG. 5, which shows a design 500 providing BIST functionality comprising an FSR 501 and a TVG 502. An embodiment of TVG 502 is illustrated in FIG. 6.

TVG 600 comprises means 601, such as a digital circuit or processing means comprising a processor and a memory, for making available the values $t_n$, one test vector per clock cycle (cf. signal "Clock"), to the outputs 602 of TVG 600. Outputs 602 of TVG 600 are connected with the test inputs of the observable cells of FSR 501, as is illustrated in FIG. 5. Specifically, for each non-trivial feedback function $f_i$ implemented in FSR 501 under test:

If the number of product terms in the ANF of $f_i$ is even, TVG output 602 $t_{OE}$ is connected with the test input of the cell with index i+1. Otherwise, i.e., if the number of product terms in the ANF of $f_i$ is odd, the output $t_{OD}$ is connected with the test input of the cell with index i+1. Note that "+" is addition modulo N.

For all n∈{1, . . . , K}, TVG output 602 $t_n$ is connected with the test input of the controllable cell which corresponds to the n-th variable in the dependence set of $g_i$ (note the relation between $f_i$ and $g_i$, Eq. (1)). That is, for non-trivial feedback functions $f_i$ having a dependence set which is smaller than the size K+1 of the largest dependence set, only the first $|dep(g_i)|$ outputs 602 $t_n$, n∈{1, . . . , $|dep(g_i)|$}, are connected.

Means 601 for making available the values $t_n$ of the test vectors via outputs 602 of TVG 600 may be adapted to generate the test values when an IC implementing TVG 600, e.g., an IC implementing FSR design 500, is powered up, or when a test sequence is initiated. Alternatively, the test set may be hard-coded or stored in a memory of TVG 600 and provided to outputs 602 by means of a processor or a logic circuit.

By providing a test set adapted for the largest dependence set of all non-trivial functions implemented by an FSR, in accordance with an embodiment of the invention, the entire combinational logic implemented by the FSR, i.e., all non-trivial feedback functions, may be tested simultaneously. Further, if all of the non-trivial feedback functions implemented by the FSR have an even number of product terms in ANF, output 602 $t_{OD}$ may be omitted. Correspondingly, if all the non-trivial feedback functions have an odd number of product terms in ANF, output 602 $t_{OE}$ may be omitted. In such cases, the number of test values $t_n$, or outputs 602, amounts to K+1.

TVG 600 comprises a "Clock" input for synchronizing the process of making available the test vectors at outputs 602 with FSR 501 and other parts of design 500. TVG 600 further comprises a "Test_enable_in" input for controlling the process of making available the test vectors at outputs 602. That is, the test vectors are only made available at outputs 602 if "Test_enable_in" is asserted. More specifically, if "Test_enable_in" is "high", a new test vector of the test set is made available at outputs 602 at each clock cycle.

Figure 7:
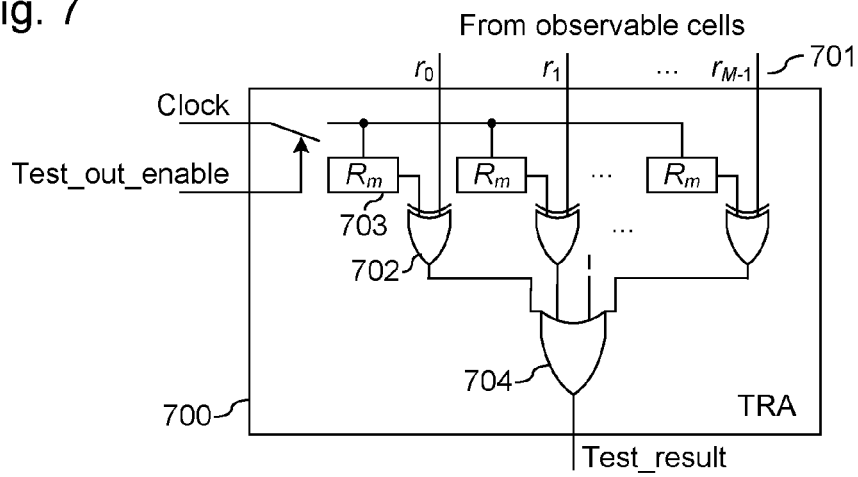
FIG. 7 illustrates a TRA, in accordance with an embodiment of the invention.

In order to analyze the test responses, i.e., the output values $r_k$, k∈{0, 1, . . . , M−1}, of the observable cells of FSR 501, design 500 is further provided with a TRA 504 which stores, or generates, the expected responses $R_m$ to the test vectors, as listed in Tables 1 and 2, and compares them to the responses $r_k$ computed by FSR 501. As was discussed before, the expected responses for the test vectors of the second test set, listed in Table 2, may differ for non-trivial feedback functions with dependence sets of different size. In the worst case, all non-trivial feedback functions may have dependence sets of different sizes. Then, in order to store the expected responses $R_m$, K+3×M bits are required, where M is the number of non-trivial feedback functions. An embodiment 700 of the TRA 504 is illustrated in FIG. 7.

TRA 700 comprises inputs 701, one input 701 for each test output of FSR 501, i.e., one input 701 for each of the M non-trivial feedback functions of FSR 501. Inputs 701 are connected to the test outputs of FSR 501, i.e., the outputs of the observable cells. Each of inputs 701 is connected with an XOR gate 702 which compares the value $r_k$ received on input 701, i.e., the current value of the corresponding observable cell of FSR 501, which an expected value $R_m$ corresponding to the currently evaluated test vector $T_m$. If the two inputs of XOR gate 702 are equal, the output of XOR gate 702 is "low". Otherwise, the output value of XOR gate 702 is "high", indicating a fault.

The outputs of all XOR gates 702 are fed into an OR gate 704 having M inputs, one for each XOR gate 702, i.e., one for each non-trivial feedback function of FSR 501. The output of OR gate 704 is made available as a signal "Test_result". If at least one of XOR gates 702 has a "high" output, the output of OR gate 704 is "high" indicating the presence of a fault for the corresponding test vector. If the outputs of all XOR gates 702 are "low", the output of OR gate 704 is "low", indicating the absence of a fault.

The expected values $R_m$ are provided by means 703, such as memory cells, registers, digital circuits, or processing means comprising a processor and a memory, adapted to provide the expected test response values which correspond to the currently evaluated test vector $T_m$, in accordance with Tables 1 and 2. With reference to Table 1, it is noted that only a single expected value $R_m$ is provided for each test vector, i.e., the expected value is the same for all non-trivial feedback functions. Further, with reference to Table 2, it is noted that two different expected values $R_m$ are provided. More specifically, for an input 701 of TRA 700 corresponding to an observable cell k of FSR 501 which is associated with a non-trivial feedback function $f_k$ having a dependence set $dep(f_k)$, if $|dep(f_k)|>m$, the expected value $R_m$ is "0". Otherwise, i.e., if $|dep(f_i)|\le m$, the expected value is "1". Since a new test vector is loaded into the controllable cells of FSR 501 at each clock cycle, as is described further below, a new expected value $R_m$ is provided by means 703 at each clock cycle. TRA 700 is controlled by means of the signal "Test_out_enable". To this end, means 703 is adapted to provide expected values to XOR gates 702 only if "Test_out_enable" is asserted.

Means 703 for making available the expected test responses may be adapted to generate the expected values when an IC implementing TRA 700 e.g., an IC implementing design 500, is powered up, or when a test sequence is initiated. Alternatively, the test set may be hard-coded or stored in a memory of TRA 700 and provided to XOR gates 702 by means of a processor or a logic circuit.

In addition to providing the inputs of each controllable cell with a MUX to enable the loading of test values into the FSR, as is illustrated for cell 420 in FIG. 4, a further improvement may be achieved by duplicating the output of each observable cell and providing the duplicated output with a switch 434, as is illustrated for cell 430 in FIG. 4. Switch 434, which cell 430 is provided with, may be controlled by means of a signal "Test_out_enable". To this end, if "Test_out_enable" is asserted, i.e., "high", the observable cells of FSR 501 are connected to both the inputs 701 of TRA 504 and to the successor cells of the observable cells. Otherwise, if "Test_out_enable" is "low", the observable cells are connected to their successor cells only. By providing the outputs of the observable cells of FSR 501 with switches, the output of test responses may be enabled selectively, e.g., only when a valid test response is expected. In this way, output of nonsense values by FSR 501, which nonsense values are fed to TRA 504, may be avoided. This is advantageous in that TRA 504, and in particular its combinational means 702 and 704 for comparing test response values fed to inputs 701 to expected values, as was described hereinbefore, is only operational when needed. Thereby, the power consumption of TRA 504 is reduced. As an alternative, if the outputs of the observable cells of FSR 501 are not provided with switches, TRA 504 may be arranged for ignoring the test response values fed into inputs 701. As yet a further alternative, the "Test_result" output of TRA 504 may be ignored, unless a valid test result is expected. However, these two alternatives result in excess power consumption caused by comparing test responses to expected values during clock cycles for which valid test responses are not expected.

Further, with reference to FIG. 5. the "Test_result" output of TRA 504 may optionally be provided to TCU 503, and TCU 503 may further be adapted to respond to a fault indication received via "Test_result".

Figure 8:
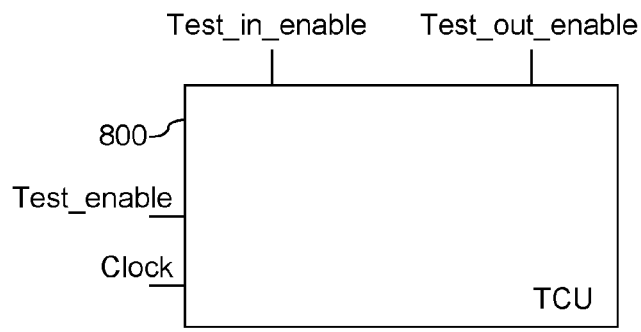
FIG. 8 illustrates a TCU, in accordance with an embodiment of the invention.

In the following, a first procedure for testing an FSR, e.g., an FSR with BIST functionality in accordance with an embodiment of the invention, such as design 500 described with reference to FIG. 5, is disclosed. The first procedure may, e.g., be implemented in a Test Control Unit (TCU) 503 which design 500 is provided with. An embodiment 800 of TCU 503 is illustrated in FIG. 8.

TCU 800 may comprise digital circuits or processing means comprising a processor and a memory adapted to control FSR 501, TVG 502, and TRA 504, so as to perform the test procedures described herein. In particular, TCU 800 is adapted to initiate testing when a "Test_enable" signal is asserted, and to control the signals "Test_in_enable" and "Test_out_enable" so as to control FSR 501, TVG 502, and TRA 504.

Accordingly, in order to perform the first test procedure, design 500 is operative to:

1. Provide the first set of test vectors, as listed in Table 1, and the second set of test vectors, as listed in Table 2. The size of the test vectors is determined by the size K+1 of the largest dependence set of the non-trivial feedback functions implemented by FSR 501. The test vectors may be provided by TVG 502.
2. Select test values as input to the controllable cells of FSR 501. This is achieved by asserting the "Test_in_enable" signal, thereby connecting the "Test_inputs" to the controllable cells. If TVG 502 is used, outputs 602 of TVG 502 are connected to the test inputs of FSR 501.
3. Apply one clock cycle to load a test vector of the set of test vectors into the controllable cells of FSR 501. The test values are loaded into all controllable cells in parallel. As was described hereinbefore, for each non-trivial feedback function $f_i$ implemented by FSR 501, the value of $t_{0E}$ or $t_{0D}$ is loaded into cell i+1, and the values of $t_n$, for all n∈{1, . . . , |dep($g_i$)|}, are loaded into the cell corresponding to the n-th variable in the dependence set of $g_i$.
4. Apply one clock cycle to evaluate the non-trivial feedback functions for the input assignment defined by the loaded test values. The resulting responses are captured by the observable cells. At the same clock cycle, another test vector is loaded into the controllable cells of FSR 501.
5. Optionally, if the observable cells are provided with duplicated outputs and switches, as was described with reference to cell 430 in FIG. 4, the "Test_out_enable" signal is asserted for making available the current values of the observable cells. In particular, by asserting "Test_out_enable" the test outputs of FSR 501 may be connected to inputs 701 of TRA 504. Thereby, the current values of the observable cells of FSR 501 are only fed into inputs 701 of TRA 504 when valid test responses are expected, as was described hereinbefore, which is the case in the following step.
6. Verify, for each observable cell k, if the test response $r_k$ equals an expected value $R_m$ corresponding to the evaluated test vector $T_m$, and indicate a fault if the test response does not equal the expected value. This may be achieved by applying one clock cycle to load the current values of the observable cells, which are test responses to the test vector loaded into the controllable cells in step 3, from the outputs of the observable cells of FSR 501 into inputs 701 of TRA 504. All output values are loaded in parallel. TRA 504 compares the computed responses $r_k$ to the expected responses $R_m$, listed in Tables 1 and 2, as was described with reference to FIG. 7. If all values match, TRA 504 indicates the result for the evaluated test vector as "passed", corresponding to a "low" on the output "Test_result" which TRA 504 is provided with. Otherwise, the output "Test_result" is "high", indicating a fault for the evaluated test vector. At the same clock cycle, the non-trivial feedback functions of FSR 501 are evaluated for the input assignment defined by the test vector loaded in step 4, and the resulting responses are captured at the observable cells. Further at the same clock cycle, a further test vector is loaded into the controllable cells of FSR 501.

It will be appreciated that the test vectors of the test set listed in Tables 1 and 2 may be loaded into FSR 501 in any order. For instance, the test vectors may be loaded in accordance with the order defined in Tables 1 and 2. That is, after the first procedure is initiated, $T_1$ is loaded in step 3, evaluated in step 4, and its test response compared to the expected values corresponding to $T_1$ in step 6. Further, $T_2$ is loaded in step 4, $T_3$ is loaded in step 6, and so forth, until the first procedure is completed for all test vectors. The first test procedure completes the application all test vectors in the test set and evaluation of all output responses in $$K+5 \qquad (6)$$

clock cycles.

The first procedure does not detect stuck-at faults at internal cells, i.e., cells which are neither controllable nor observable cells. To detect such faults, a second test procedure may be employed, utilizing test vectors $T_1$ and $T_2$ of the first test set listed in Table 1.

For the purpose of describing the second test procedure, the maximum distance between two controllable cells of an FSR is defined as follows. The union of dependence sets of all non-trivial functions $f_i$ in the FSR is $I=\{i_j|i_j\in dep(f_i) \land (g_i\neq 0)\}$, where $i_j\in\{0, 1, \ldots, N-1\}$ for j∈{0, 1, . . . , |I|}. That is, $I=\{i_1, i_2, \ldots, i_{|I|}\}$. Assuming that I is ordered as $i_1>i_2>\ldots>i_{|I|}$, the maximum distance between two controllable cells may be defined as $d=\max(i_j-i_{j+1})$ for all $i_j\in I$, where "+" is addition modulo N. For example, for Trivium, d=69, between the controllable cells 195 and 126. For Grain-128, d=32, between the controllable cells 0 and 96.

The second test procedure may, e.g., be implemented in TCU 503 in a similar manner as the first procedure. Accordingly, design 500 is operative to:

1. Optionally, if the observable cells are provided with duplicated outputs and switches, as was described with reference to cell 430 in FIG. 4, set the "Test_out_enable" signal to "low" in order to disconnect the duplicated outputs of the observable cells.

2. Assert the "Test_in_enable" signal to enable loading of test values into the test inputs of the controllable cells of FSR 501. If TVG 502 is used, the test inputs of the controllable cells are connected to outputs 602 of TVG 502.
3. Load the values of test vector $T_1$ into the controllable cells of all non-trivial feedback functions in parallel. This is achieved by applying one clock cycle.
4. Apply one clock cycle to evaluate the non-trivial feedback functions for the input assignment defined by $T_1$. The resulting output responses are captured at the observable cells of FSR 501. All internal cells capture the value of their predecessor cells. At the same clock cycle, the same test vector $T_1$ is loaded again into the controllable cells of FSR 501.
5. Step 4 is repeated at least d−2 times, where d is the maximum distance between two controllable cells. To achieve full test coverage, repeating step 4 d−2 times is sufficient.
6. Select predecessor cells as input to the controllable cells. This is achieved by setting the "Test_in_enable" signal to "low" in order to connect functional inputs of the controllable cells to their predecessor cells.
7. Apply one clock cycle to capture the value of the predecessor cells of the controllable cells into the controllable cells.
8. Apply one clock cycle to evaluate the non-trivial feedback functions for the input assignment defined by the controllable cells. The resulting output responses are captured at the observable cells.
9. Verify, for each observable cell k, if the test response $r_k$ equals the corresponding expected value $R_m$, and indicate a fault if the test response does not equal the corresponding expected value. This is achieved by, optionally, asserting the "Test_out_enable" signal to connect the test outputs of the observable cells to TRA 504, and applying one clock cycle to load the responses from all observable cells of FSR 501 to inputs 701 of TRA 504 in parallel. TRA 504 compares the test responses to the expected values. If all values match, TRA 504 indicates the result for the evaluated test vector as "passed", corresponding to a "low" on the output "Test_result" of TRA 504. Otherwise, the output "Test_result" is "high", indicating a fault for the evaluated test vector.
10. Repeat steps 1 to 9 for test vector $T_2$.

The second test procedure completes the application of test vectors and evaluation of all output responses in $$2d+6 \tag{7}$$

clock cycles.

To this end, all-zero test vector $T_1$ is applied to the controllable cells in order to detect stack-at-one faults as follows. During step 4 of the second procedure, the value "0", which is computed at the observable cells as response to $T_1$, is shifted from the controllable cells through the chain of internal cells. In d clock cycles, all cells in FSR 501 are set to zero.

Suppose that a single stuck-at-one fault occurs at a cell which is not a controllable cell. During step 4 of the second procedure, in at most d clock cycles, the change zero-to-one will propagate to the predecessor cell of the nearest controllable cell i after the faulty cell. Then, at step 5, the change zero-to-one will shift to the cell i. At step 6, the change zero-to-one will propagate to the observable cell which depends on the cell i. Since it was assumed that a single fault occurred in a cell which is not a controllable cell, all other inputs on which the cell i depends have value zero, and the change cannot be cancelled out. Therefore, at step 7, the change zero-to-one will propagate to TRA 504 and be detected accordingly.

The detection of stuck-at-one faults is more complicated since the value of a non-trivial feedback function differs for ANFs with an even and an odd number of product terms. If the ANF has an odd number of product terms one can set the value of the feedback function to one by setting all its input variables to one. If the ANF has an even number of product terms, one can set the value of the feedback function $f_i$ to one by setting all its input variables except $x_{i+1}$ to one.

To be able to set different values to the controllable cells $x_{i+1}$ of different non-trivial feedback functions $f_i$, one needs to use two test values from TVG 502. One test value, $t_{OE}$, is used for functions with an ANF having an even number of product terms. The other value, $t_{OD}$, is used for functions with an ANF having an odd number of product terms. These values are provided by the corresponding outputs 602 of TVG 600.

To detect stack-at-zero faults, test vector $T_2$ is loaded from TVG 502 to FSR 501. During step 4 of the second procedure, the value "1", which is computed at the observable cells of FSR 501 as response to $T_2$, is shifted from the observable cells through the chains of internal cells. In d−2 clock cycles, all internal cells are set to "1".

Suppose that a single stuck-at-zero fault occurs at some cell which is not a controllable cell. During step 4 of the second procedure, this change will propagate to the predecessor cell of the nearest controllable cell i after the faulty cell. Then, at step 5, the change one-to-zero will shift to the cell i. At step 6, the change one-to-zero will propagate to the observable cell which depends on the cell i. At the observable cell, the change one-to-zero can be potentially cancelled out only if the variable $x_i$ occurs in the ANF of the non-trivial feedback function associated with the observable cell in a product term comprising one or more other variables which have values "0". However, this is not possible since the only input variables which are loaded with "0" from TVG 502 are free variables. Therefore, at step 7, the change one-to-zero will be propagated to TRA 504 and detected accordingly.

The first and the second procedure described hereinbefore with respect to detecting faults in FSR 501 are advantageously also suitable for detecting faults in other parts of design 500, as is explained in the following.

Consider the case when a single stuck-at fault occurs at output 602 $t_j$, j∈{0E, 0D, 1, 2, ..., K} of TVG 502. Such a fault will manifest itself as a multiple stuck-at fault at the controllable cells of FSR 501 which are connected to the output $t_j$. Since none of the state variables occurs in more than one ANF, each faulty input will affect only one non-trivial feedback function $f_i$. Therefore, the change in values caused by the fault will not be canceled out and the fault will be detected by the first procedure.

Note that TRA 700 shown in FIG. 7 is capable of handling single stuck-at faults which occur in TRA 700, except stuck-at-zero and stuck-at-one faults at the output of OR gate 704. To allow for detection of these faults, OR gate 704 may be duplicated.

In the following, the techniques disclosed herein are illustrated for the example of the Trivium stream cipher. All non-trivial feedback functions of Trivium, $$f_{287}=x_0 \oplus x_1 x_2 \oplus x_{45} \oplus x_{219} \tag{8}$$

$$f_{194}=x_{195} \oplus x_{196} x_{197} \oplus x_{117} \oplus x_{222}, \text{ and} \tag{9}$$

$$f_{110}=x_{111} \oplus x_{112} x_{113} \oplus x_{24} \oplus x_{126}, \tag{10}$$

have dependence sets of size five, i.e., K=4, and an even number of product terms in their respective ANF representation. Accordingly, output 602 $t_{OD}$ of TVG 600 is not required, and the size of the test vectors $T_m$ is five bits (one less than Eq. (5) with K=4, since $t_{OD}$ is not required). The five outputs 602 of TVG 502 are connected to the test inputs of the controllable cells of FSR 501 of the Trivium stream cipher as follows:

$t_{OE}$ is connected to the inputs of the controllable cells 0, 195, and 111.

$t_1$ is connected to the inputs of the controllable cells 1, 196, and 112.

$t_2$ is connected to the inputs of the controllable cells indices 2, 197, and 113.

$t_3$ is connected to the inputs of the controllable cells 45, 117, and 24.

$t_4$ is connected to the inputs of the controllable cells 219, 222, and 126.

TVG 502 generates the test set as was described hereinbefore (see, e.g., Tables 1 and 2). The test set consists of the seven test vectors (Eq. (4) with K=4) listed in the Table 3 below.

TABLE 3

| $T_m$ | 0E | 1 | 2 | 3 | 4 | $R_m$ |
|---|---|---|---|---|---|---|
| $T_1$ | 0 | 0 | 0 | 0 | 0 | 0 |
| $T_2$ | 0 | 1 | 1 | 1 | 1 | 1 |
| $T_3$ | 1 | 1 | 1 | 1 | 1 | 0 |
| $T_4$ | 0 | 0 | 1 | 1 | 1 | 0 |
| $T_5$ | 0 | 1 | 0 | 1 | 1 | 0 |
| $T_6$ | 0 | 1 | 1 | 0 | 1 | 0 |
| $T_7$ | 0 | 1 | 1 | 1 | 0 | 0 |

(Header row spans $t_n$ over columns 0E, 1, 2, 3, 4.)

The first procedure takes 9 clock cycles (Eq. (6) with K=4) to complete, and the second procedure takes 144 clock cycles (Eq. (7) with d=69, between cells 195 and 126) to complete.

For Trivium, the expected test responses to the set of test vectors are the same for all non-trivial feedback functions $f_{110}$, $f_{194}$, and $f_{287}$. Therefore, it is sufficient to store only one set of expected responses, requiring seven bits, and apply it for the three functions.

The presented technique is advantageous in that the propagation delay of Trivium is not increased. It can therefore support the same data rate as the original Trivium design. This is in contrast to Trivium in scan design, in which the propagation delay of Trivium increases by the delay of a MUX, which is about 30% of the original delay.

Figure 9:
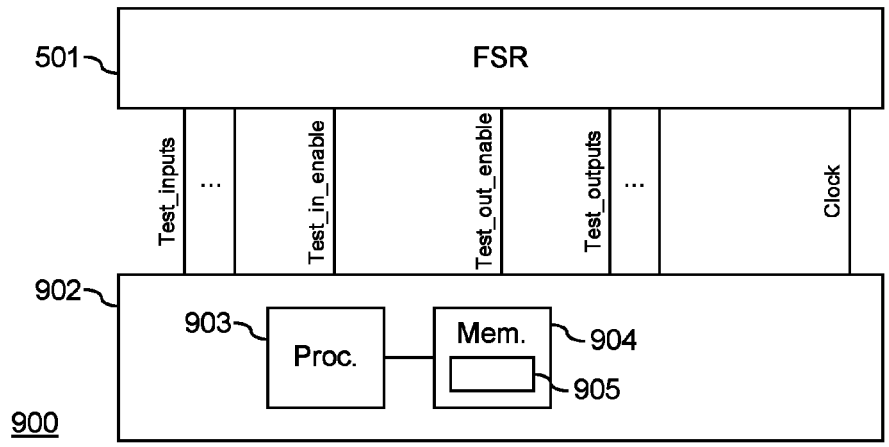
FIG. 9 shows a block diagram of an FSR design, in accordance with another embodiment of the invention.

In the following, another embodiment 900 of the invention is described with reference to FIG. 9. In contrast to FIG. 5, which illustrates design 500 comprising FSR 501, TVG 501, TRA 504, and TCU 503, which preferably are implemented on a single chip providing BIST functionality, FIG. 9 illustrates FSR 501 in combination with a processing means 902 adapted to perform the testing procedures described herein. Processing means 902 comprises a processor 903 and a memory 904. Memory 904 comprises instructions 905 executable by processor 903. Processing means 902 may be provided together with FSR 501 for the purpose of testing FSR 501, e.g., in a cryptographic system such as a stream cipher. Instructions 905 are adapted, if executed on processor 903, to implement the first and, optionally, the second test procedures described herein. In particular, instructions 905 may bed adapted to implement an embodiment of the methods described hereinafter and with reference to FIGS. 10 and 11.

Figure 10:
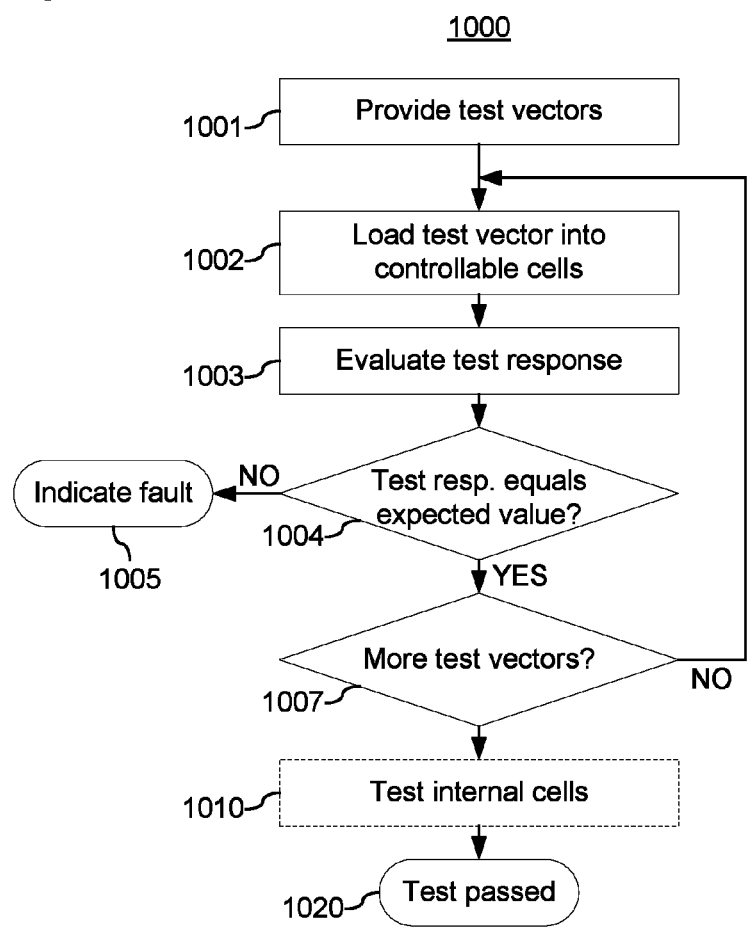
FIG. 10 shows a method of testing an FSR, in accordance with an embodiment of the invention.
Figure 11:
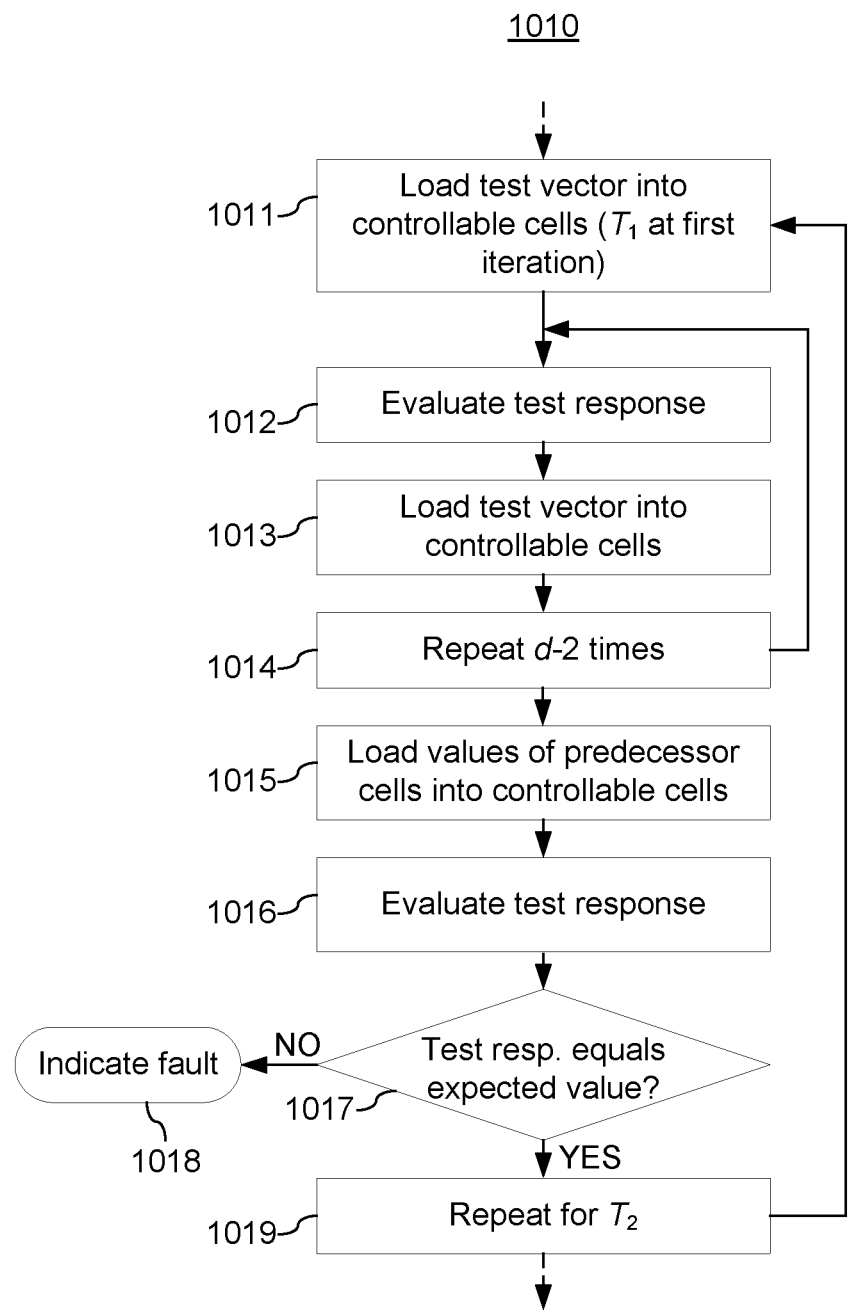
FIG. 11 shows a method of testing an FSR, in accordance with another embodiment of the invention.

With reference to FIG. 10, and embodiment 1000 of the method of testing an FSR, such as FSR 501, is now described. The FSR comprises a plurality of cells, each cell having an associated state variable and an associated Boolean feedback function, the plurality of cells comprising one or more observable cells, each observable cell being associated with a non-trivial feedback function implemented by a combinational logic circuit, and one or more controllable cells, the associated state variable of each controllable cell belonging to a dependence set of exactly one of the non-trivial feedback functions. Each cell of the FSR may be a controllable cell or an observable cell, but not both, and each controllable cell is provided with a multiplexer being arranged for selecting either a predecessor cell or a test value as input, and each observable cell is arranged for making available its current value as test response. Optionally, the observable cells of the FSR may be arranged for selectively making available the current value of each observable cell as test response only when a test response is expected, as was described with reference to FIG. 4.

Method 1000 comprises providing 1001 at least one test vector $T_m$, and for each test vector, loading 1002 the test vector into the controllable cells of the FSR and evaluating 1003, for each observable cell, the test response of the associated combinational logic circuit for the loaded test values. Each test vector comprises test values $t_n$, $n \in \{0, 1, \ldots, K\}$, wherein K+1 is a size of the largest dependence set of all non-trivial feedback functions of the FSR. For each non-trivial feedback function $f_i$ of the FSR, the value of $t_0$ is loaded into the cell with index i+1, and, for all $n \in \{1, \ldots, K\}$, the value of $t_n$ is loaded into the controllable cell corresponding to the n-th variable in the dependence set of $g_i$. The test responses are indicative of a fault in the FSR.

Preferably, a set of test vectors is provided 1001, the set comprising the following test vectors:

$T_1$: $t_0=0$, and $t_n=0$ for all $n \in \{1, \ldots, K\}$,
$T_2$: $t_0=a$, and $t_n=1$ for all $n \in \{1, \ldots, K\}$,
$T_3$: $t_0=\bar{a}$, and $t_n=1$ for all $n \in \{1, \ldots, K\}$, and
$T_{m+3}$, for all $m \in \{1, \ldots, K\}$: $t_0=a$, $t_n=0$ for n=m, and $t_n=1$ for n≠m, for all $n \in \{1, \ldots, K\}$, wherein a=0 if, for all non-trivial feedback function represented in Algebraic Normal Form, ANF, a number of product terms is even, and a=1 otherwise.

Each test vector is associated with a corresponding expected value $R_m$ for the test response of each observable cell, where $R_1=0$, $R_2=1$, $R_3=0$, $R_{m+3}=0$ if m is less than or equal to a size of the dependence set of the non-trivial feedback function associated with the observable cell, and $R_{m+3}=1$ otherwise. A test response of any one of the observable cells which is deviating from the corresponding expected value is indicative of a fault in the FSR.

If at least one of the non-trivial feedback functions, represented in ANF, has an even number of product terms and at least one of the non-trivial feedback functions has an odd number of product terms, the set of test vectors comprises:

$T_1$: $t_{OE}=0$, $t_{OD}=0$, and $t_n=0$ for all $n \in \{1, \ldots, K\}$,
$T_2$: $t_{OE}=0$, $t_{OD}=1$, and $t_n=1$ for all $n \in \{1, \ldots, K\}$,
$T_3$: $t_{OE}=1$, $t_{OD}=0$, and $t_n=1$ for all $n \in \{1, \ldots, K\}$, and
$T_{m+3}$, for all $m \in \{1, \ldots, K\}$: $t_{OE}=0$, $t_{OD}=1$, $t_n=0$ for n=m, and $t_n=1$ for n≠m, for all $n \in \{1, \ldots, K\}$.

For each test vector $T_m$, the value of $t_{OE}$ is loaded 1002 into the cell i+1 for each non-trivial feedback function $f_i$ having an even number of product terms, and the value of $t_{OD}$ is loaded 1002 into the cell i+1 for each non-trivial feedback function $f_i$ having an odd number of product terms.

Preferably, method 1000 comprises, verifying 1004, for each test vector and for each observable cell, if the test response equals the corresponding expected value and indicating 1005 a fault if the test response does not equal the corresponding expected value. Preferably, method 1000 iterates 1007 through all test vectors of the test set. If no fault is detected for any one of the test vectors, method 1000 terminates indicating 1020 the test results as "passed". The steps of method 1000 described with reference to FIG. 10 correspond to the first test procedure.

Preferably, method 1000 further comprises testing 1010 the internal cells of the FSR. For this purpose, method 1000 preferably further comprises, for each of the test vectors $T_1$ and $T_2$, loading 1011 the values of the test vector into the controllable cells, evaluating 1012, for each observable cell, the test response of the associated combinational logic circuit for the loaded test values, and loading 1013 the values of the test vector into the controllable cells. Steps 1012 and 1013 are repeated 1014 at least d−2 times, where d is the maximum distance between two controllable cells. In order to archive full test coverage, it is sufficient to repeat 1014 steps 1012 and 1013 are repeated d−2 times. Further for testing 1010 the internal cells, method 1000 preferably further comprises loading 1015 the current values of the predecessor cells of the controllable cells into the controllable cells, and evaluating 1016, for each observable cell, the test response of the associated combinational logic circuit for the values loaded from the predecessor cells. Preferably, it is verified 1017, for each test vector and for each observable cell, if the test response equals the corresponding expected value and a fault is indicated 1018 if the test response does not equal the corresponding expected value. The steps of method 1000 described with reference to FIG. 11 correspond to the second test procedure. If $T_1$ is used for the first iteration, these steps are repeated 1019 for $T_2$.

Figure 12:
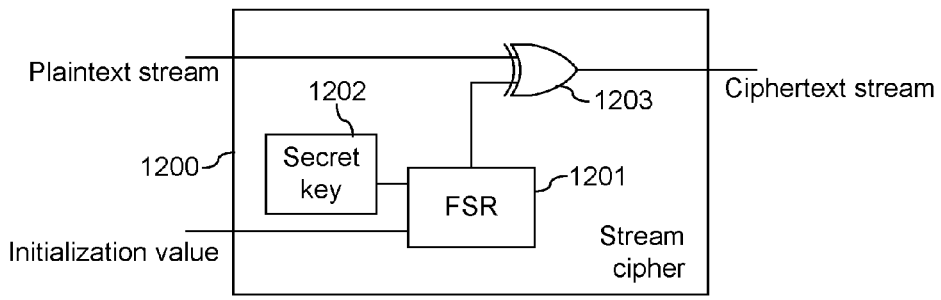
FIG. 12 illustrates a cryptographic system comprising an FSR, in accordance with an embodiment of the invention.
Figure 13:
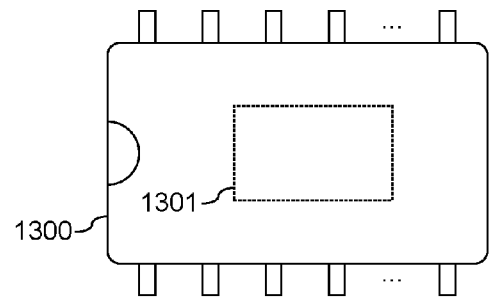
FIG. 13 illustrates an IC implementing an FSR, in accordance with an embodiment of the invention.
Figure 14:
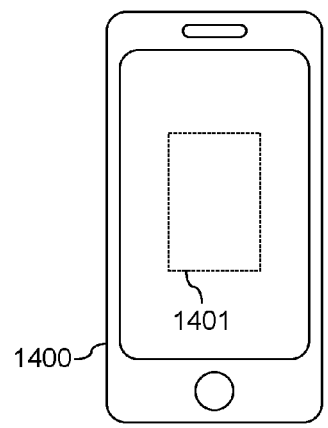
FIG. 14 shows a mobile phone comprising an FSR, in accordance with an embodiment of the invention.

In FIGS. 12 to 14, further embodiments of the invention are illustrated. FIG. 12 shows a stream cipher 1200, as an example for a cryptographic system, based on an FSR 1201 in accordance with an embodiment of the invention, such as FSR 501 described with reference to FIGS. 5 and 9, and preferably design 500, i.e., an FSR with BIST functionality. Stream cipher 1200 further comprises means 1202 for generating a secret key which is used as input, together with an initialization value, to FSR 1201 which serves as pseudo-random number generator for generating a keystream. The keystream generated by FSR 1201 is logically combined by means 1203, such as an XOR gate, with the plaintext stream into a ciphertext stream.

FIG. 13 shows in IC 1300 implementing an FSR 1301 in accordance with an embodiment of the invention, such as FSR 501 or design 500. As an alternative, IC 1300 may implement a cryptographic system in accordance with an embodiment of the invention, such as stream cipher 1200.

FIG. 14 shows a mobile terminal 1400, such as a mobile phone or User Equipment (UE), comprising a FSR 1401 in accordance with an embodiment of the invention, such as FSR 501 or design 500. As an alternative, mobile terminal 1400 may implement a cryptographic system in accordance with an embodiment of the invention, such as stream cipher 1200.

The person skilled in the art realizes that the invention by no means is limited to the embodiments described above. On the contrary, many modifications and variations are possible within the scope of the appended claims.

The invention claimed is:

1. A Feedback Shift-Register, FSR, comprising:
a plurality of cells i, i∈{0,1, . . . , N−1}, each cell i having an associated state variable $x_i \in \{0,1\}$ which represents a current value of the cell and an associated Boolean feedback function $f_i : \{0,1\}^N \to \{0,1\}$ of type $$f_i(x_0, x_1, \ldots, x_{N-1}) = x_{i+1} \oplus g_i(x_0, x_1, \ldots, x_{N-1}),$$

which determines how the associated state variable is updated, wherein the feedback function $f_i$ for each cell has a dependence set of $g_i$, the feedback function $f_i$ being a non-trivial feedback function $f_i$ when $g_i \neq 0$ such that there is a plurality of non-trivial feedback functions $f_i$, for the plurality of cells, the plurality of cells comprising:
an observable cell, wherein the feedback function $f_i$ associated with the observable cell is a non-trivial feedback function $f_i$ implemented by a combinational logic circuit, and
a controllable cell, the associated state variable of the controllable cell belonging to a dependence set of exactly one of the plurality of non-trivial feedback functions $f_i$, such that the associated state variable of the controllable cell serves as an input to the exactly one of the plurality of non-trivial feedback functions $f_i$, wherein each cell may be a controllable cell or an observable cell, but not both, and wherein each controllable cell i is provided with a multiplexer being arranged for selecting either a predecessor cell i+1 or a test value as input, and each observable cell is arranged for making available its current value as test response, the FSR adapted to:
acquire at least one test vector $T_m$, each test vector comprising test values $t_n$, n∈{0,1, . . . , K}, wherein K+1 is a size of a largest dependence set of the plurality of non-trivial feedback functions $f_i$, and
for each test vector:
load the test vector into the controllable cell, wherein, for each of the plurality of non-trivial feedback functions $f_i$:
the value of $t_0$ is loaded into the cell i+1, and
for all n∈{1, . . . , K}, the value of $t_n$ is loaded into the controllable cell corresponding to the n-th variable in the dependence set of $g_i$ and
evaluate, for each observable cell, the test response of the combinational logic circuit associated with the observable cell for the test values of the test vector, the test responses being indicative of a fault in the FSR.

2. The FSR according to claim 1, wherein the at least one test vector belongs to a set of test vectors, the set of test vectors comprising:
$T_1$: $t_0=0$, and $t_n=0$ for all n∈{1, . . . , K},
$T_2$: $t_0=a$, and $t_n=1$ for all n∈{1, . . . , K},
$T_3$: $t_0=a$, and $t_n=1$ for all n∈{1, . . . , K}, and
$T_{m+3}$, for all m∈{1, . . . , K}: $t_0=a$, $t_n=0$ for n=m, and $t_n=1$ for n m, for all n∈{1, . . . , K},
wherein a=0 if, for all non-trivial feedback function $f_i$ represented in
Algebraic Normal Form, ANF, a number of product terms is even, and a=1 otherwise, wherein each test vector $T_m$ is associated with a corresponding expected value $R_m$ for the test response $r_k$ of each observable cell k, k∈{0,1, . . . , M−1}, where $R_1=0$, $R_2=1$, $R_3=0$, $R_{m+3}=0$ if m is less than or equal to a size of the dependence set of the non-trivial feedback function $f_i$ associated with the observable cell, and $R_{m+3}=1$ otherwise, and wherein the test response of any one of the observable cells deviating from the corresponding expected value is indicative of a fault in the FSR.

3. The FSR according to claim 2, wherein at least one of the non-trivial feedback functions $f_i$, represented in ANF, has an even number of product terms and at least one of the non-trivial feedback functions has an odd number of product terms, the set of test vectors comprising:

$T_1$: $t_{0E}=0$, $t_{0D}=0$, and $t_n=0$ for all $n \in \{1, \ldots, K\}$,
$T_2$: $t_{0E}=0$, $t_{0D}=1$, and $t_n=1$ for all $n \in \{1, \ldots, K\}$,
$T_3$: $t_{0E}=1$, $t_{0D}=0$, and $t_n=1$ for all $n \in \{1, \ldots, K\}$, and
$T_{m+3}$, for all $m \in \{1, \ldots, K\}$: $t_{0E}=0$, $t_{0D}=1$, $t_n=0$ for n=m, and $t_n=1$ for n≠m, for all $n \in \{1, \ldots, K\}$, wherein, for each test vector:
for each non-trivial feedback function $f_i$ having an even number of product terms, the value of $t_{0E}$ is loaded into the cell i+1, and
for each non-trivial feedback function $f_i$ having an odd number of product terms, the value of $t_{0D}$ is loaded into the cell i+1.

4. The FSR according to claim 1, the FSR further adapted to, for each of the test vectors $T_1$ and $T_2$:
load the values of the test vector into the controllable cell,
repeat at least d−1 times, where d is the maximum distance between two controllable cells:
evaluate, for each observable cell, the test response of the combinational logic circuit associated with the observable cell for the test values of the test vector, and
load the values of the test vector into the controllable cell,
load the current values of the predecessor cells of the controllable cell into the controllable cell, and
evaluate, for each observable cell, the test response of the combinational logic circuit for the values loaded from the predecessor cells.

5. The FSR according to claim 1, further comprising circuitry adapted to provide the at least one test vector.

6. The FSR according to claim 2, further comprising circuitry adapted to, for each test vector:
verify, for the observable cell, if the test response equals the corresponding expected value, and
indicate a fault if the test response does not equal the corresponding expected value.

7. The FSR according to claim 1, further comprising circuitry to selectively make available the current value of each observable cell as test response only when the test response is expected.

8. The FSR according to claim 1, further comprising means adapted to perform a self-test of the FSR.

9. A cryptographic system comprising the FSR according to claim 1.

10. An Integrated Circuit, IC, comprising the FSR according to claim 1.

11. A mobile terminal comprising the FSR according to claim 1.

12. A method of testing a Feedback Shift-Register, FSR, comprising:
a plurality of cells i, $i \in \{0,1, \ldots, N-1\}$, each cell i having an associated state variable $x_i \in \{0,1\}$ which represents a current value of the cell and an associated Boolean feedback function $f_i: \{0,1\}^N \to \{0,1\}$ of type $f_i(x_0, x_1, \ldots, x_{N-1}) = x_{i+1} \oplus g_i(x_0, x_1, \ldots, x_{N-1})$, which determines how the associated state variable is updated, wherein the feedback function $f_i$ for each cell has a dependence set of $g_i$, the feedback function $f_i$ being a non-trivial feedback function $f_i$ when $g_i \neq 0$ such that there is a plurality of non-trivial feedback functions $f_i$ for the plurality of cells, the plurality of cells comprising:
an observable cell, wherein the feedback function $f_i$ associated with the observable cell is a non-trivial function $f_i$ implemented by a combinational logic circuit, and
a controllable cell, the associated state variable of the controllable cell belonging to a dependence set of exactly one of the plurality of non-trivial feedback functions $f_i$, such that the associated state variable of the controllable cell serves as an input to the exactly one of the plurality of non-trivial feedback functions $f_i$,
wherein each cell may be a controllable cell or an observable cell, but not both, and wherein each controllable cell i is provided with a multiplexer being arranged for selecting either a predecessor cell i+1 or a test value as input, and each observable cell is arranged for making available its current value as test response, the method comprising:
providing at least one test vector $T_m$, each test vector comprising test values $t_n$, $n \in \{0,1, \ldots, K\}$, wherein K+1 is a size of a largest dependence set of the plurality of non-trivial feedback functions $f_i$, and
for each test vector:
loading the test vector into the controllable cell, wherein, for each of the plurality of non-trivial feedback functions $f_i$:
the value of $t_0$ is loaded into the cell i+1, and
for all $n \in \{1, \ldots, K\}$, the value of $t_n$ is loaded into the controllable cell corresponding to the n-th variable in the dependence set of $g_i$, and
evaluating, for each observable cell, the test response of the combinational logic circuit associated with the observable cell for the test values of the test vector, the test responses being indicative of a fault in the FSR.

13. The Method according to claim 12, wherein the at least one test vector belongs to a set of test vectors, the set of test vectors comprising:
$T_1$: $t_0=0$, and $t_n=0$ for all $n \in \{1, \ldots, K\}$,
$T_2$: $t_0=a$, and $t_n=1$ for all $n \in \{1, \ldots, K\}$,
$T_3$: $t_0=\bar{a}$, and $t_n=1$ for all $n \in \{1, \ldots, K\}$, and
$T_{m+3}$, for all $m \in \{1, \ldots, K\}$: $t_0=a$, $t_n=0$ for n=m, and $t_n=1$ for n m, for all $n \in \{1, \ldots, K\}$,
wherein a=0 if, for all non-trivial feedback functions $f_i$ represented in Algebraic Normal Form, ANF, a number of product terms is even, and a=1 otherwise, wherein each test vector is associated with a corresponding expected value $R_m$ for the test response $r_k$ of each observable cell k, $k \in \{0,1, \ldots, M-1\}$, where $R_1=0$, $R_2=1$, $R_3=0$, $R_{m+3}=0$ if m is less than or equal to a size of the dependence set of the non-trivial feedback function $f_i$ associated with the observable cell, and $R_{m+3}=1$ otherwise, and wherein the test response of any one of the observable cells deviating from the corresponding expected value is indicative of a fault in the FSR.

14. The method according to claim 13, wherein at least one of the non-trivial feedback functions, represented in ANF, has an even number of product terms and at least one of the non-trivial feedback functions has an odd number of product terms, the set of test vectors comprising:
$T_1$: $t_{0E}=0$, $t_{0D}=0$, and $t_n=0$ for all $n \in \{1, \ldots, K\}$,
$T_2$: $t_{0E}=0$, $t_{0D}=1$, and $t_n=1$ for all $n \in \{1, \ldots, K\}$,
$T_3$: $t_{0E}=1$, $t_{0D}=0$, and $t_n=1$ for all $n \in \{1, \ldots, K\}$, and
$T_{m+3}$, for all $m \in \{1, \ldots, K\}$: $t_{0E}=0$, $t_{0D}=1$, $t_n=0$ for n=m, and $t_n=1$ for n≠m, for all $n \in \{1, \ldots, K\}$, wherein, for each test vector:
for each non-trivial feedback function $f_i$ having an even number of product terms, the value of $t_{0E}$ is loaded into the cell i+1, and
for each non-trivial feedback function $f_i$ having an odd number of product terms, the value of $t_{0D}$ is loaded into the cell i+1.

15. The method according to claim 12, further comprising, for each of the test vectors $T_1$ and $T_2$:
loading the values of the test vector into the controllable cell,
repeating at least d−1 times, where d is the maximum distance between two controllable cells:
evaluating, for each observable cell, the test response of the combinational logic circuit associated with the observable cell for the test values of the test vector, and
loading the values of the test vector into the one or more controllable cells,
loading the current values of the predecessor cells of the one or more controllable cells into the one or more controllable cells, and
evaluating, for each observable cell, the test response of the combinational logic circuit associated with the observable cell for the values loaded from the predecessor cells.

16. The method according to claim 13, further comprising, for each test vector:
verifying, for each observable cell, if the test response equals the corresponding expected value, and
indicating a fault if the test response does not equal the corresponding expected value.

17. A computer program product comprising a non-transitory computer readable storage medium storing instructions, the instructions being adapted, when executed on at least one processor to implement the method according to claim 12.

* * * * *